STABILIZED VARIABLE FREQUENCY MULTIVIBRATOR
Filed Dec. 23, 1966
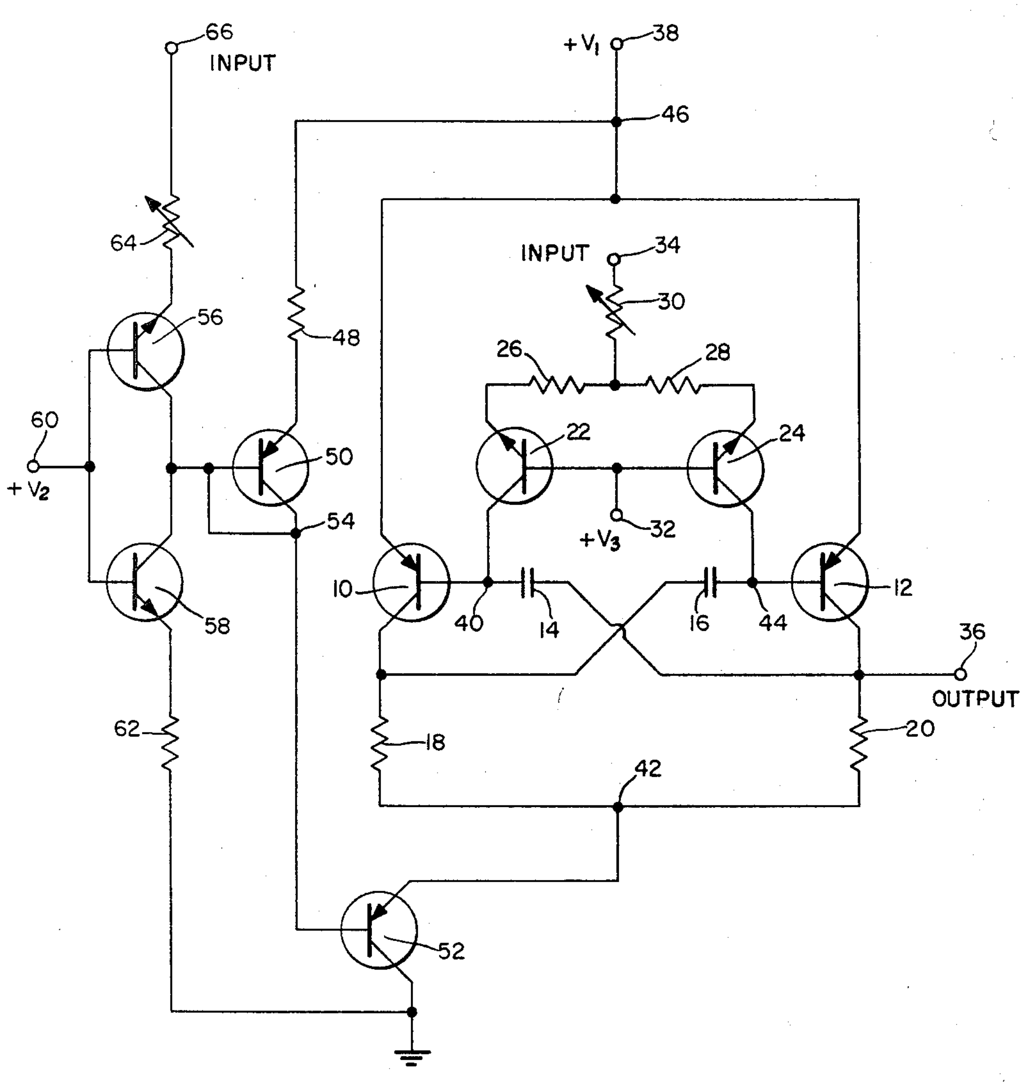
INVENTOR.
ROBERT E. SHERLIN
BY R H Quist
ATTORNEY.

United States Patent Office 3,400,337

Patented Sept. 3, 1968

3,400,337

STABILIZED VARIABLE FREQUENCY MULTIVIBRATOR

Robert E. Sherlin, Ormond Beach, Fla., assignor to General Electric Company, a corporation of New York Filed Dec. 23, 1966, Ser. No. 604,245
3 Claims. (Cl. 331—113)

ABSTRACT OF THE DISCLOSURE

A collector-coupled transistor multivibrator with variable resistance paths (including another set of transistors) substituted for the usual fixed resistors. The charging rate of the capacitors is varied, in one case, by varying the impedance of these paths. A transistor is connected across the oscillator to maintain a constant voltage drop in spite of changes in supply voltage. Varying the base current of this transistor is an alternate means of varying the oscillator frequency.

*Background of the invention*

This invention relates generally to a circuit capable of producing a frequency output which can be varied as a function of a control voltage or a control impedance, and in particular to a circuit especially suited for miniaturization by use of thin film or monolithic microcircuit techniques.

In the past oscillators have been devised in which the frequency can be varied by changing a control voltage. In one such approach, the sine wave oscillator, a linear relationship between the control voltage and the resulting frequency is achieved, but only in a restricted range. The sine wave oscillator has the advantage that the frequency is relatively independent of variations in the power supply since the frequency is determined in a tank circuit. Another advantage of the sine wave oscillator is its flexibility. Since control voltages are generally supplied by other equipment, and depending on this other equipment may be in different ranges, (e.g., 0 to 5 volts, 0 to 50 volts, etc.), some change in oscillator components is required to adapt the oscillator to new ranges. In the sine wave oscillator the change is merely one of adjusting a voltage divider appropriately.

Another approach to voltage controlled oscillators is the square wave oscillator having a frequency which is a function of one or more of its supply voltages. A problem with this circuit is that oscillation will cease if the control voltage approaches zero. This is generally overcome by supplying from a power supply a minimum voltage, and applying the control voltage as a variation above this minimum. However, if there should be a change in the voltage in the power supply, for example by a decrease in the voltage of a battery over a period of time, it appears to the square wave oscillator as a change in the control voltage. The square wave oscillator has the advantage of a wider range of linearity between the control voltage and resulting frequency than the sine wave oscillator.

In the case where only a small power supply is available, so that battery drain is important, the prior art circuits are not suitable.

*Summary*

It is, therefore, an object of this invention to provide a variable frequency oscillator which combines the wide range linearity of the square wave oscillator with the flexibility of the sine wave oscillator as well as its independence from power supply variations.

It is also an object of this invention to provide such an oscillator in a design which overcomes the problem of achieving absolute resistance values in thin film or monolithic microcircuitry.

In a preferred form of the invention, the usual astable multivibrator circuit having a fixed frequency is modified by substituting transitor circuitry for the fixed resistances (which together with capacitors determine the frequency). This transistor circuitry acts as a variable resistance, the magnitude of which can be changed by changing the voltage applied. If the voltage applied at this point is held constant, the frequency of the oscillator can also be varied by another means. The capacitors in the multivibrator charge at a rate which depends on the voltage and current applied. By varying the charging rate, the frequency can be varied. Additional transistor circuitry is provided for this purpose.

*Brief description of the drawing*

The figure is a schematic circuit diagram of one embodiment of the invention.

*Description of the preferred embodiment*

Referring now to the figure, a collector-coupled transistor multivibrator (free-running) of conventional design (with one exception) composed of transistors 10 and 12, capacitors 14 and 16, and resistors 18 and 20, is formed when connected to the collectors of transistors 22 and 24. Transistors 22 and 24, together with resistors 26 and 28, and adjustable resistor 30, are substituted for the usual resistors of the multivibrator.

Terminal 32 is used as a voltage reference. Since terminal 32 supplies only the bases of transistors 22 and 24 the power drain will be small and the voltage can therefore be maintained at a constant level more easily.

Resistors 26 and 28 are made to have equal resistances which are high compared to the emitter to base resistances of transistors 22 and 24. The absolute resistance value of resistors 26 and 28 is not critical since the purpose of these resistors is merely to assure substantially equal division of the current flowing to terminal 34 through transistors 22 and 24.

The output signal of the circuitry thus far described is produced at terminal 36, while the input power is largely derived from terminal 38. The power drain on terminal 38 may cause variations in the voltage at this point. Such voltage variations do not affect the frequency of the oscillator provided the voltage does not go too low as will be discussed later.

Assuming the circuitry on the left of the figure (which has not yet been described) is operating at a constant level, one method of varying the frequency will now be described. In the usual oscillator configuration, resistors would be connected between junctions 40 and 42, and between junctions 44 and 42. Instead of fixing the period of the oscillator by using fixed resistances, in the present circuit what amounts to a variable resistance has been substituted. Terminal 32 continuously supplies a small base current at a low potential to transistors 22 and 24, keeping these transistors in a conducting condition. Current flows from junctions 40 and 44 at a rate determined by resistors 26 and 28, resistor 30, and the voltage at terminal 34, controlling the charging rate of capacitors. By adjusting the potential at terminal 34 the frequency of the oscillator will be adjusted. Only small changes in this potential are required to substantially change the frequency. The circuit thus can be used to monitor a sensor which produces small voltages with moderate voltage changes.

The frequency can also be adjusted by adjusting adjustable resistor 30. Again, small changes in resistance produce relatively large frequency changes. This method of control may be used where a sensor or the like has a resistance which varies only slightly in response to some change (substituting the impedance of the sensor for adjustable resistor 30).

Considering only that part of the circuit already described, it can be seen that a change in the potential at terminal 38 (for example, because a battery was being used up), would cause an undesired change in frequency. This disadvantage does not occur with this circuit. A fixed voltage drop from terminal 38 to junction 42 is maintained by the circuitry at the left of the figure despite changes in the supply voltage at terminal 38. This result can be obtained only down to the point where the potential at terminal 38 still exceeds this fixed voltage drop.

Transistor 52 is connected in an emitter follower configuration to establish the voltage drop from junction 42 to ground. In order to maintain a constant voltage drop from terminal 38 to junction 42 (so that changes in the potential at terminal 38 will not affect frequency), it is necessary that a drop in potential at terminal 38 be accompanied by a drop of the same magnitude across the emitter-collector junction of transistor 52. Since a drop in potential at terminal 38 will cause a reduction in the base voltage of transistor 52, the voltage of the emitter also decreases, thereby maintaining the desired constant voltage drop from terminal 38 to junction 42. Transistor 50 functions essentially as a diode, and is physically positioned close to transistor 52 so that both of these transistors will be equally affected by temperature changes. With this arrangement a temperature change causing a change in the operation of transistor 52 will be counterbalanced by the change in transistor 50 to prevent any change in frequency because of varying temperatures.

A second method of controlling the frequency of the oscillator is to deliberately vary the voltage drop across transistor 52. For example, if this voltage drop is decreased capacitors 14 and 16 will discharge earlier and the frequency will increase. The base voltage of transistor 52 can be changed by drawing more current from junction 54 to the collector of transistor 56. Transistors 56 and 58 are supplied base current from terminal 60. Terminal 60 may be connected to the same source as terminal 32. Since the amount of current required is small, the potential of the source can be kept constant more easily. A fixed current from junction 54 passes through transistor 58 and resistor 62 to ground. A current which can be varied passes through transistor 56 and adjustable resistor 64 to terminal 66. By adjusting either the potential at terminal 66 or the resistance of resistor 64, the magnitude of the current flowing through this part of the circuit from transistor 50 can be varied. Thus a variable impedance path away from the base of transistor 52 is provided. This changes the base voltage of transistor 52 which causes the current through transistor 52 to change. As indicated above, when the current through transistor 52 changes, the frequency of the oscillator changes.

The potential at terminal 66 may be changed by the output of a transducer or a sensor as was mentioned with respect to terminal 34. The primary difference is that a relatively large change in potential at terminal 66 is required to achieve the same change in frequency caused by a small change in potential at terminal 34. In a similar manner, a relatively large change in the resistance of resistor 64 causes the same frequency change which results from a small change in the resistance of resistor 30. An additional difference between the two methods of controlling the oscillator is that the frequency is directly proportional to voltage changes caused at terminal 34 (and those by changing resistor 30), while the period of the oscillator is directly proportional to voltage changes caused at terminal 66 (and those by changing resistor 64). The circuit therefore has a flexibility of application, permitting its use whether large or small control voltages or impedances are available. Moreover, those components which draw relatively large amounts of power (remembering that microcircuitry is primarily contemplated) are supplied by a source not required to be maintained at an exact potential, while the components (bases of transistors 22, 24, 56 and 58) requiring more exact control of potential, draw little power.

The fabrication of microcircuits at the present time makes the use of transistors more feasible than the use of some other conventional components. Thus in this circuit transistors have been used where other components might be substituted in conventional circuit design. In addition, because exact values of resistance can not be readily achieved, this circuit is designed so that ratios of resistances rather than absolute values are important. Moreover, the presence of all the transistors on the same chip tends to keep relative values the same even when a change in temperature causes changes. Finally, the circuit achieves the wide range of linearity between voltage changes and resulting frequency or period changes of the square wave oscillator, while at the same time maintaining frequency independent from changes in the voltage of the primary power supply.

The frequency of the oscillator will be:

$$f=2I/CE \qquad (1)$$

where:

$I$=the charging current of capacitor 14 or 16,
$C$=the capacitance of capacitors 14 and 16, and
$E$=the voltage between terminal 38 and junction 42.

The current $I=I_{16}=I_{14}$ and:

$$I_{14}=\frac{\alpha_{22}(V_{32}-V_{22}-V_{34})}{2R_{30}+R_{26}} \qquad (2)$$

where:

$\alpha_{22}$=the gain of transistor 22,
$V_{32}$=the voltage at terminal 32,
$V_{22}$=the base to emitter drop of transistor 22,
$V_{34}$=the voltage at terminal 34,
$R_{30}$=the resistance of resistor 30, and
$R_{26}$=the resistance of resistor 26.

As indicated previously, the voltage at terminal 32 and the resistance of resistor 26 are preferably fixed. The frequency is therefore varied by adjusting $V_{34}$ (the voltage at terminal 34) or $R_{30}$ (the resistance of resistor 30).

Also, the voltage E (Equation 1) will be equal to:

$$E=V_{50}-V_{52}+R_{48}\left[\frac{\alpha_{58}(V_{60}-V_{58})}{R_{62}}+\frac{\alpha_{56}(V_{60}-V_{56}-V_{66})}{R_{64}}\right]$$

where:

$V_{50}$=the voltage across the emitter-collector junction of transistor 50,
$V_{52}$=the voltage from base to emitter of transistor 52,
$R_{48}$=the resistance of resistor 48,
$\alpha_{58}$=the gain of transistor 58,
$V_{60}$=the voltage at terminal 60,
$V_{58}$=the base to emitter drop of transistor 58,
$R_{62}$=the resistance of resistor 62,
$\alpha_{56}$=the gain of transistor 56,
$V_{56}$=the base to emitter drop of transistor 56,
$V_{66}$=the voltage at terminal 66, and
$R_{64}$=the resistance of resistor 64.

From the foregoing it can be seen that the frequency can be varied by adjusting $V_{66}$ (the voltage at terminal 66) or $R_{64}$ (the resistance of resistor 64).

While a particular embodiment of a variable frequency oscillator has been shown and described, it will be obvious that changes and modifications can be made without departing from the spirit of the invention and the scope of the appended claims.

What is claimed as new and desired to be secured by Letters Patent of the United States is:

1. A variable frequency oscillator comprising:
a first power supply 38,
first and second transistors 10 and 12 having their emitters connected to said first power supply, a first capacitor 14 having one terminal connected to the base of sair first transistor and the other terminal connected to the collector of said second transistor, a second capacitor 16 having one terminal connected to the base of said second transistor and the other terminal connected to the collector of said first transistor, third and fourth transistors 22 and 24 having their collectors connected to the bases of said first and second transistors respectively, a second power supply 32 connected to the bases of said third and fourth transistors, variable voltage means connected to the emitters of said third and fourth transistors, and a fifth transistor 52 having its base connected to said first power supply, its emitter connected to the collectors of said first and second transistors, and its collector connected to ground, whereby a change in the potential of said power supply produces a change of the same magnitude and direction across said fifth transistor and the voltage across said oscillator remains constant.

2. An oscillator according to claim 1 further comprising:

base potential varying means connected to the base of said fifth transistor for varying the potential applied to said base, whereby the frequency of said oscillator will be varied.

3. An oscillator according to claim 1 further comprising:

a sixth transistor 50 positioned between said first power supply and said fifth transistor with its emitter connected to said first power supply, its collector connected to the base of said fifth transistor, variable voltage means connected to its base, and physically positioned close to said fifth transistor, whereby temperature changes which induce changes in the operation of said fifth transistor will also induce counterbalancing changes in said sixth transistor and no frequency change will occur.

References Cited

UNITED STATES PATENTS 3,010,078 11/1961 Stefanov __________ 331—113 X

OTHER REFERENCES

Biddlecomb, R. W.: "Latest Multivibrator Improvement," Electronics, Apr. 26, 1963, pp. 64, 65, 331–113.

Comer, D. T.: "Directly Linear Period Controlled Multivibrator," IBM Technical Disclosure Bulletin, vol. 8, No. 2, July 1965, pp. 336, 337, 331–113.

ROY LAKE, *Primary Examiner.*

S. H. GRIMM, *Assistant Examiner.*